United States Patent [19]

Nees et al.

[11] Patent Number: 4,745,361
[45] Date of Patent: May 17, 1988

[54] ELECTRO-OPTIC MEASUREMENT (NETWORK ANALYSIS) SYSTEM

[75] Inventors: John A. Nees; Gerard A. Mourou; Todd A. Jackson, all of Rochester, N.Y.

[73] Assignee: University of Rochester, Rochester, N.Y.

[21] Appl. No.: 21,089

[22] Filed: Mar. 3, 1987

[51] Int. Cl.$^4$ ............................................. G01R 27/00
[52] U.S. Cl. ................... 324/158 R; 324/58 B; 324/77 K
[58] Field of Search .................. 324/73 R, 77 K, 71.3, 324/158 D, 158 I, 158 R, 96, 58 R, 58 A, 58 B, 58.5 R, 58.5 A, 58.5 B; 356/432 J, 445, 448

[56] References Cited

U.S. PATENT DOCUMENTS

| 3,490,037 | 1/1970 | Williams | 324/58.5 B |
| 4,381,485 | 4/1983 | Steinbrecher | 324/58.5 R |
| 4,427,936 | 1/1984 | Riblet et al. | 324/58 B |
| 4,482,863 | 11/1984 | Auston et al. | 324/158 D |
| 4,681,449 | 7/1987 | Bloom et al. | 324/77 K |

FOREIGN PATENT DOCUMENTS 2040478  8/1980  United Kingdom ............. 324/58 B

OTHER PUBLICATIONS

"Microwaves as an Industrial Tool", by Summerhill Measurement and Instrum. Rev., 2/69, pp. 79-81.
"Noninvasive Beam—Wave Reflectometric Instrumentation for Measuring Complex Permitting of Dielectric Materials at Microwave Frequencies", by Neelakantasuramy, Rev. Sci.-Instrum. 49(6) 6/78, pp. 858-860.
"Performance of a Dual Six-Port Automatic Network Analyzer", by Hoer, IEEE Trans on Microwave The. and Techniques, MTT-27, #12, 12/79, pp. 993-998.
E. E. Cooper et al., Proc. Topical Mtg., Lake Tahoe, Nevada, Mar. 13-15, 1985, p. 62 (Springer-Verlag) 1985.

A. M. Nicholson et al., IEEE Trans. Microwave T & T., MTT-20 (1), 3 (1972).
Valdmanis & Mourou, IEEE J. Quan. Elect., QE-22 (1), 69 (1986).

Primary Examiner—Reinhard J. Eisenzopf
Assistant Examiner—W. Burns
Attorney, Agent, or Firm—Martin Lukacher

[57] ABSTRACT

A measurement system using electro-optic sampling and operative in the time domain characterizes devices over a bandwidth extending to upper microwave frequencies (e.g., 100 GHz). The device under test is mounted to or integrated on a substrate of electro-optic semiconductor material and is connected to transmisison and lines on the substrate. Sampling signals are electro-optically generated and propagate along the lines toward and away from the device under test, using a laser pulse beam incident on the substrate. The signals are electrically sampled by a laser pulse sampling beam which is responsive to the change in refractive index due to the signal at locations equidistant from the generation position. The waveform resulting from electro-optic sampling near the device under test corresponds to the sum of the signal incident upon the device and the signal reflected therefrom. The waveform resulting from electro-optic sampling at the location away from the device corresponds to the incident waveform. The waveforms are processed by subtracting the waveform corresponding to the incident signal from the waveform corresponding to the sum of the incident and reflected signal and Fourier transformed to derive the scattering parameters. The laser pulses are very short (in the picosecond or sub-picosecond range) and the transmission lines are uniform in their attenuation and dispersion characteristics, thereby enabling measurements to be made to extremely high microwave frequencies in the time domain and converted by Fourier transform to the frequency domain to determine the scattering parameters characterizing devices operative at such high frequencies.

20 Claims, 3 Drawing Sheets

ELECTRO-OPTIC MEASUREMENT (NETWORK ANALYSIS) SYSTEM

DESCRIPTION

The present invention relates to electro-optic measurement systems, and particularly to an electronic device or network analyzer operative to characterize the response of devices and networks which are operative at extremely high frequencies in the range of 10s to 100s of GHz.

The invention is especially suitable for measuring the S or scattering parameters of high frequency devices, networks and materials such as microwave devices and integrated circuits operative over bandwidths extending into the upper microwave frequency range. The term device comprehends such devices, networks and materials, inclusively. The measurement of such scattering parameters characterizes the response of the device and provides necessary information for the design of networks such as microwave amplifiers, mixers and phase-shifters and fast computer components.

Scattering or S-parameter device characterization is used to provide necessary information for the design of linear networks such as microwave amplifiers, mixers and phase-shifters. S-parameters are also useful to characterize other high frequency devices such as integrated circuits which operate with very short, picosecond and sub-picosecond pulses, so as to perform computer operations at extremely high speed.

At present S-parameters are typically measured using frequency domain techniques wherein signals are applied to the device under test and swept in frequency over the bandwidth of interest. The S-parameters so measured can be used to predict linear network time domain responses. The time domain response is the transient response of the device to short pulses. Time domain measurements have been used to determine the S-parameters of microwave devices and networks.

In prior systems using either frequency domain or time domain techniques, a limiting factor is the bandwidth of the system. Bandwidth is limited by reason for the need of complex fixtures including waveguides and other microwave transmission lines which have transitions therebetween. Such signal transmitting elements tend to be narrow band devices, incapable of handling bandwidths to the upper end of the frequency range of interest which may be of the order of 100 GHz. They are also difficult to construct, each transition causes mismatches, losses and even distortion of the signal. Another limiting factor is the bandwidth of the instruments which are used to make the measurements. In frequency domain techniques, instruments which heterodyne the detected signals down to lower frequencies have been needed. Such heterodyning techniques tend to limit conventional frequency domain techniques to a maximum frequency well below the 100 GHz range which is needed to characterize many high frequency devices. In time domain measurements, the frequency range is limited because pulse generators capable of providing pulses in the picosecond and sub-picosecond range so as to have spectral responses covering the bandwith of interest are difficult to implement and to couple to the device under test. Also, the pulses transmitted to the device and pulses reflected therefrom have been measured by instruments such as sampling oscilloscopes which are not responsive over the entire frequency range of interest. The typical sampling oscilloscopes cover a range up to 10 to 20 GHz, which is well below the 100 GHz range necessary to characterize many high frequency devices. It has been reported that frequency domain techniques are limited to a 26 GHz bandwidth. See E. E. Cooper and S. C. Moss, "Picosecond Optoelectronic Diagnostics of Field Effect Transistors", Proceedings of the Topical Meeting, Lake Tahoe, Nev., Mar. 13 to 15, 1985, page 62 (Springer-Verlag 1985). It has been proposed to generate pulses for time domain measurements using solid state optoelectronic switches and to sample the signal with a second optoelectronic switch. The sample signals are difficult to extract and to measure. Reference may also be had to an article by A. M. Nicholson, et al., "Applications of Time-Domain Metrology to the Automation of Broad-Band Microwave Measurements", IEEE Transactions on Microwave Theory and Techniques, MTT-20(1), (3) 1972 for further information respecting time domain measurements for characterizing microwave devices.

Techniques have been provided for the acquisition and measurement of waveforms over a bandwidth of 100s of GHz with electro-optic sampling techniques. See J. A. Valdmanis and G. Mourou, "Subpicosecond Electro-Optic Sampling: Principles and Applications", IEEE Journal of Quantum Electronics, Q.E.-22(1), 69 (1986) and U.S. Pat. Nos. 4,446,426 issued to Valdmanis, et al. and 4,603,293 issued to Mourou, et al.

It has been discovered in accordance with the invention how to adapt and apply such electro-optic sampling techniques to enable waveform acquisition for time domain measurements of parameters which characterize devices over the frequency range of interest (e.g., to 100 GHz and above). Such systems apply both stimulus and sampling optical pulses which are inherently synchronized to enable accurate waveform acquisition. In accordance with the invention, the locations for the application of the stimulus optical pulses and the generation and launching of ultra-short signals having spectral responses over the frequency range of interest and the location of the electro-optic sampling are selected so as to derive waveforms which accommodate attenuation and dispersion (distortion) of the signals incident on and reflected from the device under test, thereby allowing the acquisition of the incident and reflected waveforms with a high degree of accuracy. Such waveforms may be translated, as by Fourier transform techniques, into the frequency domain to derive S-parameters of the device under test.

It is the principal object of the present invention to provide an improved measurement system which makes possible the use of electro-optic sampling to analyze at microwave frequencies (100 GHz and higher) the parameters which characterize microwave devices and other devices which operate at such frequences.

It is a still further object of the present invention to provide an improved measurement system whereby the range of time domain measurements for characterizing high frequency devices is extended to the upper microwave frequencies (e.g., 100 GHz and higher) by the use of electro-optical sampling.

It is a still further object of the present invention to provide an improved electro-optic measurement system which is capable of measuring response characteristics of electrical devices beyond 100 GHz.

It is a still further object of the present invention to provide an improved measurement system operative in the time domain for determining the characteristics of devices and response to pulses wherein distortion (attenuation and dispersion) of the pulses which would perturb the measurements is reduced.

It is a still further object of the present invention to provide an improved electro-optic measurement system wherein striplines are connected to the device under test in a manner to provide matched terminations and prevent oscillation which would prevent characterization of the device under test.

It is a still further object of the present invention to provide an improved measurement system for scattering parameter device characterization which avoids the need for complex test fixtures (waveguide to stripline transitions, directional couplers, etc.) which limit the frequency band over which the measurement can accurately be made.

It is a still further object of the present invention to provide an improved electro-optic system for scattering parameter device characterization which enables measurements of the waveforms of incident and reflected signals to be made directly at the ports of the device under test thereby avoiding distortion (attenuation and dispersion) which can result when measurements are made at locations physically removed from the device.

It is a still further object of the present invention to provide an improved system for characterization of microwave and other high frequency devices which avoids the need for correction and adjustment of measurements to compensate for the defects of the fixture which applies signals to the device under test (including the connections from measuring instruments to the device under test).

Briefly described, an electro-optic system for characterizing the properties of an electronic device with a bandwith in the 100 GHz range utilizes a body of electro-optic semiconductor material having a plurality of transmission lines thereon. The device under test is disposed adjacent to the body and connected to the transmission lines. Means are provided for applying a first beam of repetitive optical pulses in the picosecond or sub-picosecond range to generate signals which propagate along the transmission lines from a first location spaced from the device under test, both in a direction toward the device and in a direction away from the device, to provide test signals. Means are provided for electro-optically sampling the test signals with a second beam of optical pulses which is incident upon the body at second and third locations along the lines equally distant from the first location. Electro-optic sampling provides first waveform of the signal which is incident upon the device, and a second waveform corresponding to the sum of the incident waveform and the waveform of the signal reflected from the device. Means are provided for processing the waveforms so as to derive outputs characterizing the device. The processing means includes means for obtaining the difference between the first and second waveforms so as to accurately acquire the waveforms of the incident and reflected signals from which S-parameters may be determined, as by the use of Fourier transform and other computational techniques.

The foregoing and other object, features and advantages of the invention, as well as a presently preferred embodiment thereof, will become more apparent from a reading of the following description in connection with the accompanying drawings in which.

Figure 1:
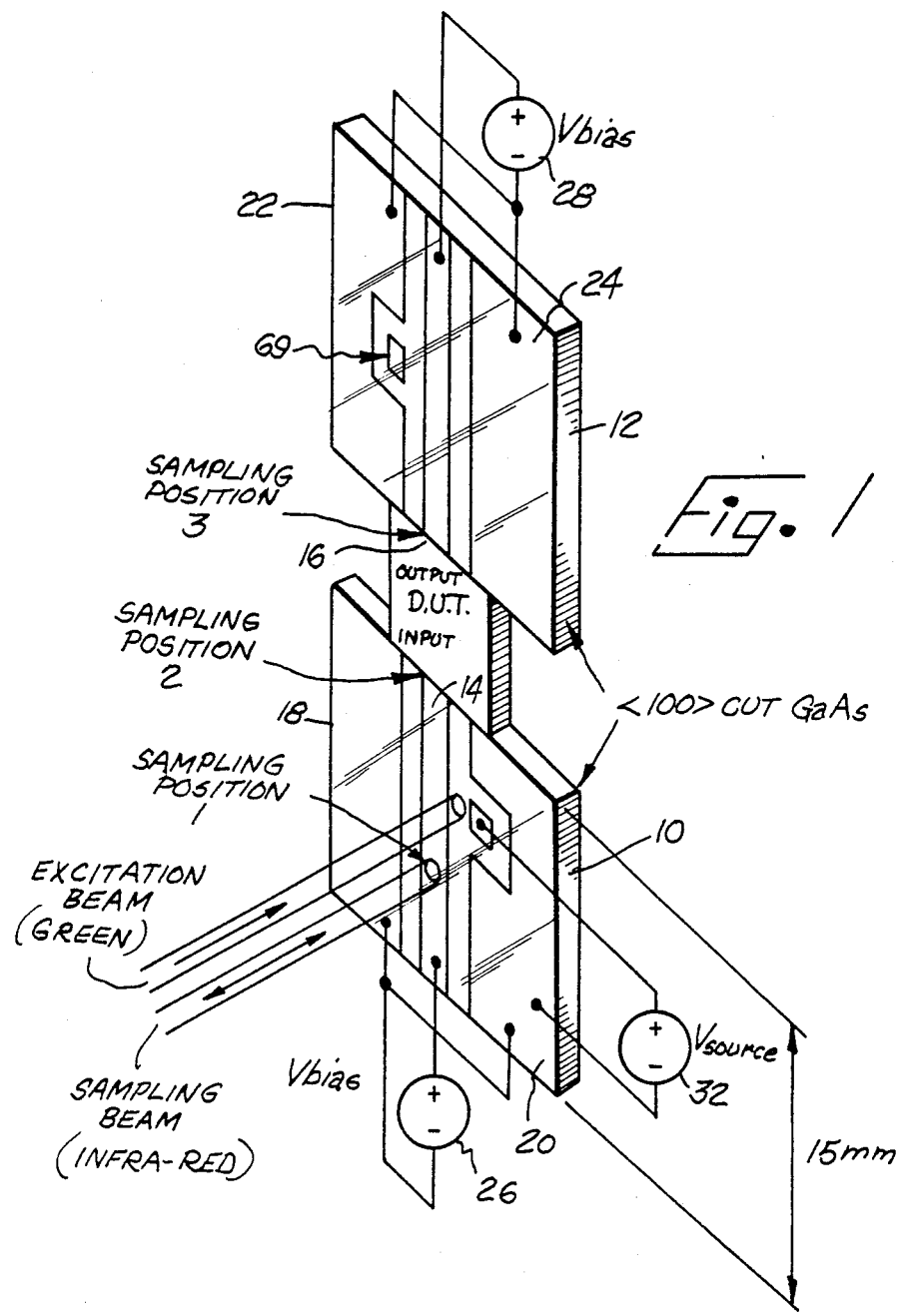
FIG. 1 is a diagrammatic, perspective view of a portion of the electro-optic measurement system, embodying the invention, for characterizing the properties of a device under test.

Referring to FIG. 1, there is shown a fixture wherein the device under test is embedded or integrated into a plurality of transmission lines on bodies of electro-optic semiconductor material which provides substrates for the lines. There may be two such bodies or substrates 10 and 12. They have co-planar transmission lines including center striplines 14 and 16 spaced from and parallel to outer striplines 18 and 20 and 22 and 24 to define a balanced co-planar stripline waveguide. The input ports (connections) of the device under test (which may be an integrated circuit, transistor, or other device operative at high microwave frequencies) are connected as by short leads to the striplines. The input port connections are connected to the striplines 14, 18 and 20, while the output port connections are connected to the striplines 16, 22 and 24. The striplines can be designed to provide matched terminations to the ports of the device under test (DUT) so as to prevent oscillations. Operating voltages indicated as V-bias are applied to the striplines from sources 26 and 28 of DC voltage which provide the requisite bias for the DUT. The outer lines 18 and 20 and 22 and 24 need not cover the entire surface on one side of the device, but may leave areas thereabout.

The gallium arsenide (GaAs) substrates 10 and 12 in this example are approximately 15 millimeters (mm) long, ½ mm thick and 1 mm wide. Another electro-optic semiconductor material may be used so long as it is capable of photoconductively generating a short circuit when an optical pulse is applied thereto and also exhibits an index of refraction change (in accordance with a Pockels effect) in response to the electric field due to signals propagating along the transmission lines thereon. A GaAs crystal having a 100 cut so that its optical axis is parallel to the axis of the sampling beams is preferably used. The GaAs substrates 10 and 12 may be mounted on a glass slide which is penetrated by the sampling beam. This slide would be on the side of the substrate opposite to the side on which the striplines 14 to 24 are disposed. It is not shown to simplify the illustration. Alternatively, a single body of electro-optic semiconductor material may be used with the striplines removed in the area on which the DUT is disposed.

At a short distance on the order of millimeters, for example, 5 millimeters, from the DUT input port, a notch is provided in one of the strips so as to expose a pad 30 of the stripline. This pad may have a projection towards the center stripline 14. An exitation beam of laser pulses is used to photoconductively generate a short across the transmission line. This provides conduction from a source of photoconductive switch bias voltage 32. This source may be a 100 KHz A.C. (sine wave) of approximately 10 volts rms amplitude. The exitation beam pulses are repetitive pulses, for example, of two picoseconds (ps) duration. At 100 MHz, each pulse provides conduction during a small portion of a cycle of the 100 KHz photoconductive switch bias voltage from the source 32. Each pulse of the exitation beam provides a corresponding electrical pulse at the precise location of the beam. This pulse is launched at that location as an incident signal which propagates along the striplines 14, 18, 20 in a direction towards the input port of the device under test and in a direction away from the input port of the device under test. Alternately, the switch bias source 32 may be connected to the switch bias pad 69 and the exitation beam may be incident on the gap between the switch bias pad 69 and the center stripline (16) on the side of the device output port.

Since the transmission line is linear and uniform, the distortion (attenuation and dispersion) of these optically generated pulse signals are identical functions of propagation distance. The pulse signal propagating towards the DUT serves as the stimulus incident pulse.

The incident pulses are sampled directly at the input port of the DUT (position 2) by a sampling beam which penetrates the substrate through the side opposite to the side on which the exitation beam is incident. The sampling beam is reflected and its polarization is varied in accordance with the Pockels effect due to the field at the sampling position. This field is a function of both the incident and reflected signals from the input port of the DUT.

Waveform acquisition at the DUT input port provides a waveform corresponding to the sum of the incident and reflected signals. Sum signals cannot be directly used in the determination of the DUT's S-parameters.

Since two optically generated pulses undergo the same attenuation and dispersion after propagating the same distance, an accurate image of the incident signal is obtained by sampling the pulse signal propagating away from the DUT. Sampling position 1 and sampling position 2 are both equally distant from the position where the signal is launched by the exitation beam. Sampling position 2 is therefore also, like the DUT, approximately 5 millimeters from the position of the pad 30 in this illustrative embodiment of the invention.

The reflected signal waveform is obtained as the difference of the incident waveform derived by electro-optic sampling at position 1 and the waveform representing the sum of the incident and reflected signals which is derived by electro-optic sampling at position 2.

Figure 3:
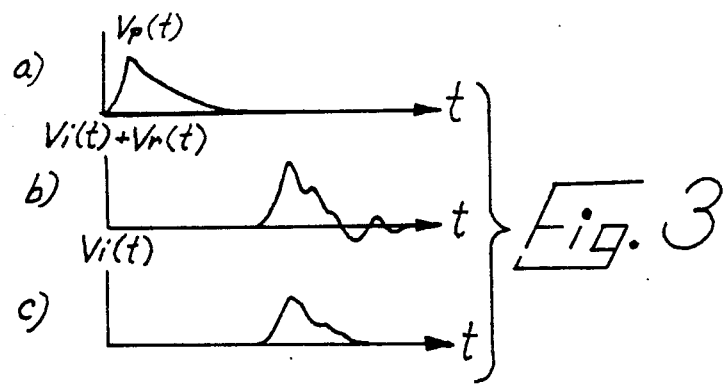
FIG. 3 is a set of waveforms of the pulses electro-optically generated and acquired by electro-optic sampling through the use of the system illustrated in FIGS. 1 and 2.

FIG. 3 waveform (a) shows a generated pulse $V_p(t)$. Waveform (c) shows the waveform of the pulse at position 1. This is the incident waveform $V_i(t)$. At sampling position 2, the sum of the incident and reflected waveforms at the input port of the DUT is measured. The signal, $V_i(t)+V_r(t)$, is obtained as shown as waveform (b). It can be observed that by subtracting the waveform $V_i(t)$ from the sum waveform, that the reflected waveform $V_r(t)$ can be derived.

The sampling beam may be moved to sampling position 3 to derive the transmitted waveform at the output port of the DUT. The $S_{11}$ and $S_{21}$ scattering parameters may be computed using the incident, reflected and transmitted waveforms, as will be described more fully hereinafter in connection with FIGS. 4 and 5. When the $S_{12}$ and $S_{22}$ parameters are to be determined, the exitation beam is focused in a notch having a pad, (like that of the pad 30) which is disposed on the output port side of the DUT onto the substrate 12. The waveform of the sum of the incident and reflected signals at the output port is derived at sampling position 3 and the incident waveform is derived at another sampling position on the opposite side of the exitation position which is at the same distance from the exitation position as is sampling position 3. The arrangement of sources of photoconductive switch bias on the output port side of the DUT (striplines 22 and 24) is not shown in FIG. 1 to simplify the illustration.

It will be appreciated that in the event that the $S_{12}$ and $S_{22}$ parameters are to be determined, the substrate 12 should be of the same dimensions as the substrate 10 and have a similar array of striplines thereon.

Figure 2:
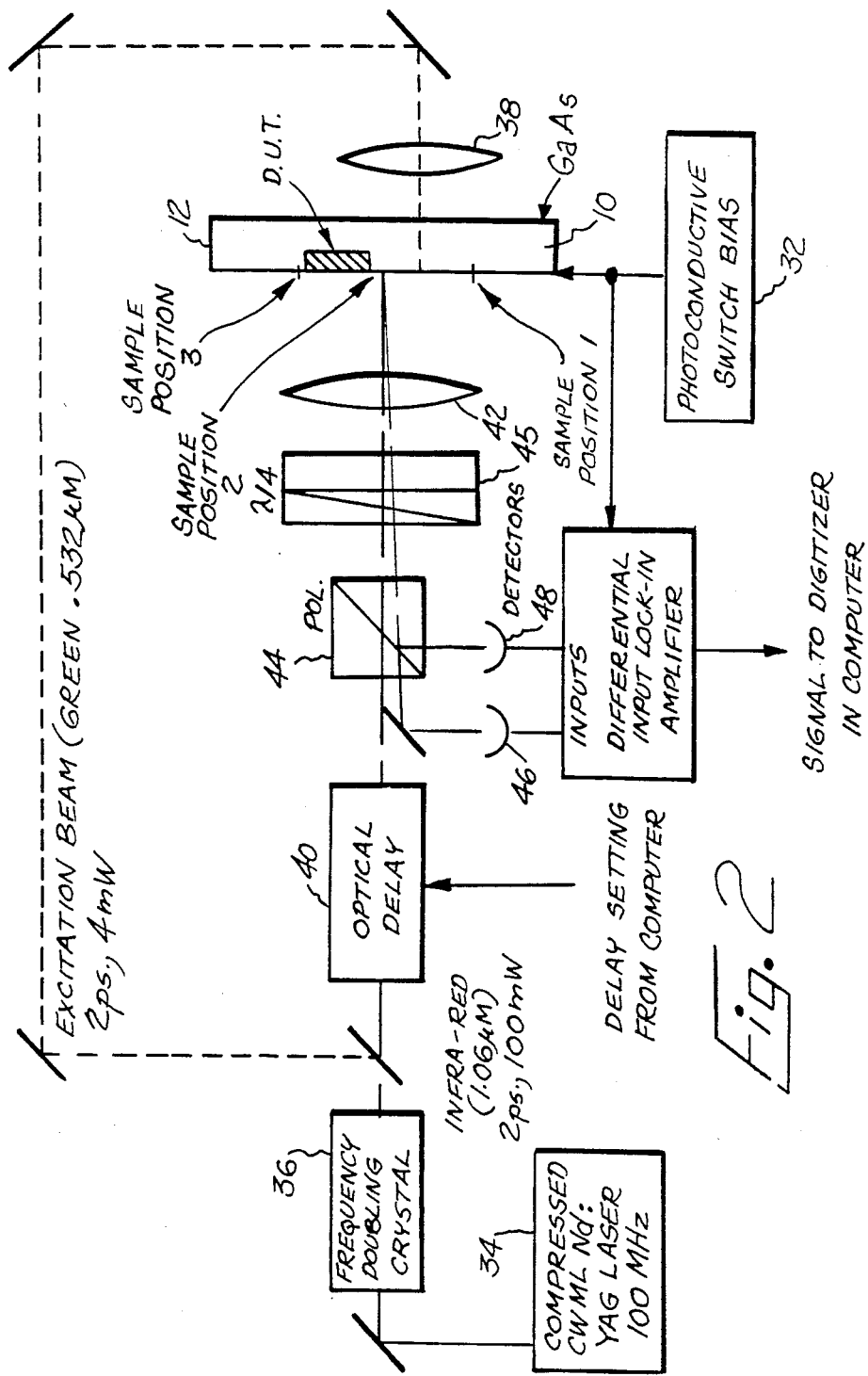
FIG. 2 is a block diagram showing the elements of the system of FIG. 1 and other instrumentation used in the system.

Referring to FIG. 2 there is shown the electro-optic sampling system and the means for providing excitation pulses in synchronous relationship with the sampling pulses. This synchronous relationship is obtained since the same laser, suitably a CW modelocked Nd: YAG laser 34 which produces laser pulses at a 100 MHz rate is the common source of both the excitation and the sampling beam. This laser 34 provides an output beam to a frequency doubling crystal 36 which produces the excitation beam and also passes the infrared sampling beam. The power of the beams is indicated in the figure as is their wavelength in micrometers. The excitation beam is focused by a lens 38 at the excitation position which is equidistant from the sampling positions 1 and 2. The sampling beam may be moved to the various positions or the fixture including the substrates and the device under test may be translated. It will be appreciated that the sampling beam is incident on the side of the substrate opposite to the side thereof on which the striplines are disposed. The sampling beam is passed through an optical delay such as a moving prism or corner reflector stage as shown in the above-referenced US Patents. The movement of the stage and the delay setting is controllable so as to enable the waveform to be acquired after sampling with a multiplicity of sampling pulses. The sampling pulse is focused by a lens 42 at the sampling positions. It is shown focused at sampling position 2 in FIG. 2. A polarizer 44 and quarter wavelength compensator (wave plate) 45 is in the path of the sampling beam. The sampling beam penetrates the substrate where the index is varied in accordance with the intensity of the field due to the signal. The compensator 45 and the polarizer 44, now acting as an analyzer, provides output pulses depending upon the change in index to detectors 46 and 48, which may be PIN diode photodetectors. The electrical signals transduced by the detectors 46 and 48 are derived by a differential input lock-in amplifier 50. The amplifier is operated at the rate of the 100 KHz photoconductive switch bias voltage from the source 32. Alternatively, if an AC source of photoconductive switch bias is not used and the DC switch bias source is used, a chopper may be inserted in the excitation beam path. Averaging of the signal may be accomplished by an averaging circuit (an R-C) at the output of the lock-in amplifier. The lock-in amplifier then provides the waveform of the signal detected at the sample position to the computer which provides further processing for determining the scattering parameters. For further information respecting electro-optic sampling reference may be had to the above-identified article by J. A. Valdmanis and G. Mourou and to the above-referenced US Patents.

Figure 4:
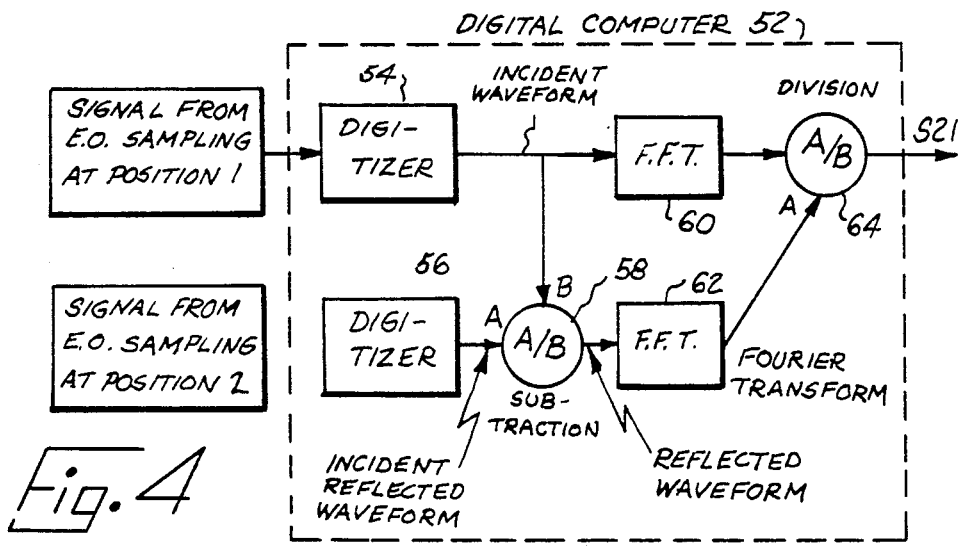
FIG. 4 is a block diagram of the computer system which is used to measure one of the scattering parameters.

Referring to FIG. 4 there is shown a computer 52 to which are inputted signals corresponding to the waveforms of the incident signal (Vi(t)) from sampling position 1 and the waveform corresponding to the sum of the incident and reflected waveforms from sampling position 2. It will be appreciated that these signals need not be derived simultaneously in real time but may be stored in memory after digitization in digitizers 54 and 56. The digital representation of the incident waveform and the sum of the incident and reflected waveforms are subtracted in a subtraction stage 58 of the computer 52. The subtraction stage provides the digital representation of the reflected waveform Vr(t). The incident and reflected waveforms are Fourier transformed by a fast Fourier transform (FFT) 60 and 62 in the computer to provide outputs A and B. The ratio of A and B, as obtained by a division stage 64 in the computer 52, provides the $S_{11}$ scattering parameter. The use of digital processing and fast Fourier transforms to obtain the frequency domain analog of the time domain waveforms is discussed in the above-referenced articles by Cooper et al. and Nicholson et al.

Figure 5:
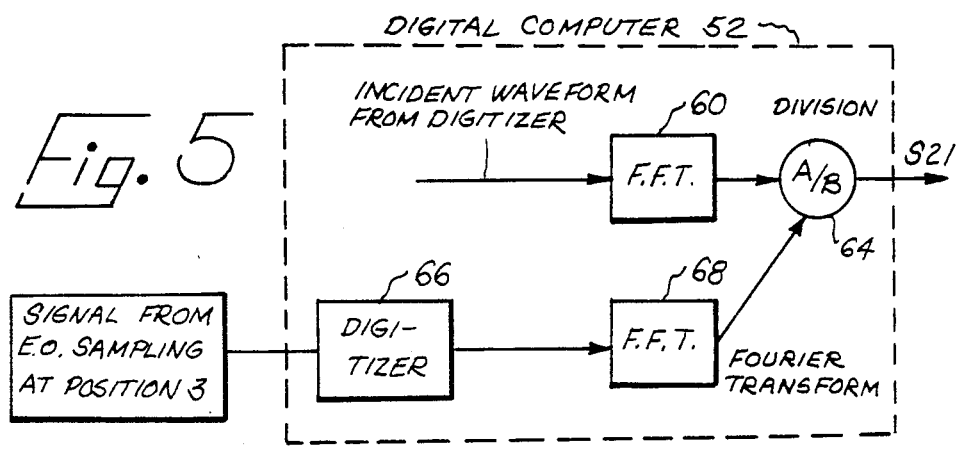
FIG. 5 is a block diagram of the computer system used to measure another scattering parameter.

Referring to FIG. 5 the digital computer 52 is adapted to obtain the $S_{21}$ scattering parameter using the signal from electro-optic sampling at position 3. This signal is the transmitted signal from the device in response to the input pulses, which is digitized in a digitizer stage 66 to provide a digital representation which may be stored before Fourier transformation in a FFT stage 68 to provide an output C. The $S_{21}$ scattering parameter is determined in the division stage 64 from the ratio of outputs C and B. The $S_{12}$ and $S_{22}$ parameters may be calculated using the digital computer 52 in a manner similar to the calculation of the $S_{11}$ and $S_{21}$ parameters.

From the foregoing description it will be apparent that there has been provided an improved system for characterizing electronic devices and other apparatus. While an electro-optic S-parameter measurement system has been illustrated, variations and modifications in such system and the use of such system for other parameters (e.g., X, Z & Y parameters) in accordance with the invention will undoubtedly suggest themselves to those skilled in the art. Accordingly, the foregoing description should be taken as illustrative and not in a limiting sense.

We claim:

1. An electro-optic system for characterizing the properties of an electronic device with a bandwidth in the 100 GHz range which comprises a body of electro-optic semiconductor material having a plurality of transmission lines thereon, said device being disposed adjacent to said body and connected to said lines, means for applying a first beam of repetitive optical pulses in the picosecond or sub-picosecond range to generate electrical signals which propagate along said transmission lines from a first location spaced from said device where the signals are reflected from said device in a direction toward said device and in a direction away from said device, means for electro-optically sampling said signals with a second beam of optical pulses at second and third locations along said lines equidistant from said first location respectively toward and away from said first location to measure a first waveform of the signal which is incident upon said device and a second waveform corresponding to the sum of the incident waveform and the waveform of the signal reflected from said device, and means for processing said waveforms were deriving an output characterizing said device, said processing means including means for obtaining the difference between said first and second waveforms.

2. The system according to claim 1 wherein said body and said lines extend from opposite sides of said device and said lines are connected to input ports and output ports on opposite sides of said device and wherein said second beam is also incident upon said body adjacent to said output ports for sampling a third waveform of the signal from said output port, said processor means having means responsive to said first waveform and said third waveform for deriving a further output characterizing said device.

3. The system according to claim 1 wherein said transmission lines are striplines extending parallel to each other.

4. The system according to claim 3 wherein one of said lines has a gap at said first location on which said first beam is incident.

5. The system according to claim 1 wherein said second location is immediately adjacent to said device.

6. The system according to claim 5 wherein said distance between said first location and said second location is of the order of single millimeters and the distance between said first and third location is also of the order of single millimeters.

7. The system according to claim 1 wherein said first beam is a laser beam of shorter wavelength than said second beam which is also a laser beam.

8. The system according to claim 1 wherein said second beam is of infrared wavelength (about 1.06 micrometer) and said second beam is about half the wavelength of said first beam.

9. The system according to claim 1 wherein said semiconductor material of said body is GaAs and is a substrate upon which said lines are disposed.

10. The system according to claim 9 wherein said second beam is of infrared wavelength (about 1.06 micrometer) and said second beam is about half the wavelength of said first beam.

11. The system according to claim 1 wherein the pulses of said first and second beams are in synchronous relationship.

12. The system according to claim 11 wherein said sampling means includes a laser which provides a common source for said first and second beams whereby the pulses thereof are in said synchronous relationship.

13. The System according to claim 1 wherein said material has an index of refraction which changes in response to an electric field applied thereto in accordance with the Pockels effect, and wherein said second beam is incident on said body at said second and third locations and is responsive to the change in index of refraction in said body resulting from the electric field due to said signal at said locations in accordance with the Pockels effect.

14. The system according to claim 13 wherein said first and second beams are incident on said body from opposite sides thereof.

15. The system according to claim 14 wherein said first beam is incident upon the side of said body upon which said lines are disposed.

16. The system according to claim 13 wherein said electro-optic sampling means includes means responsive to said second beam upon reflection from said body for deriving said waveforms.

17. The system according to claim 1 wherein said processing means includes means for deriving the Fourier transform of said first and second waveforms, and means for deriving a first scattering parameter characterizing said device from the ratio of said Fourier transforms.

18. The system according to claim 2 wherein said processing means includes means for deriving the Fourier transform of said first and second waveforms, and means for deriving a first scattering parameter characterizing said device from the ratio of said Fourier transforms, means for deriving the Fourier transform of said third waveform, and means for deriving a second scattering parameter from the ratio of the Fourier transforms of said first and third waveforms.

19. A system for characterizing the properties of a device which comprises means for generating a pulse signal at a first location spaced from said device and propagating said signal towards said device where it is incident thereon and also away from said device, means for detecting said signal at second and third locations respectively towards and away from said device which are equidistant from said first location, and means responsive to the signal detected at said third location and the difference of the signals detected at said second and third locations for providing an output characterizing the properties of said device.

20. The system according to claim 19 further comprising means having uniform effects on said signal for supporting propagation thereof towards and away from said device.

* * * * *